(12) United States Patent
Feichtinger et al.

(10) Patent No.: US 10,980,105 B2
(45) Date of Patent: Apr. 13, 2021

(54) CARRIER WITH A PASSIVE COOLING FUNCTION FOR A SEMICONDUCTOR COMPONENT

(71) Applicants: TDK Electroncis AG, Munich (DE); AT&S Austria Technologie & Systemtechnik AG, Leoben (AT)

(72) Inventors: Thomas Feichtinger, Graz (AT); Oliver Dernovsek, Lieboch (AT); Franz Rinner, Deutschlandsberg (AT); Christian Vockenberger, Leoben (AT)

(73) Assignees: TDK Electroncis AG, Munich (DE); AT&S Austria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 15/561,504

(22) PCT Filed: Mar. 1, 2016

(86) PCT No.: PCT/EP2016/054321
§ 371 (c)(1),
(2) Date: Sep. 25, 2017

(87) PCT Pub. No.: WO2016/150662
PCT Pub. Date: Sep. 29, 2016

(65) Prior Publication Data
US 2018/0070436 A1 Mar. 8, 2018

(30) Foreign Application Priority Data
Mar. 26, 2015 (DE) .......... 10 2015 104 641

(51) Int. Cl.
*H05K 1/02* (2006.01)
*H01L 25/16* (2006.01)
(Continued)

(52) U.S. Cl.
CPC ......... *H05K 1/0206* (2013.01); *H01L 25/167* (2013.01); *H01L 33/54* (2013.01);
(Continued)

(58) Field of Classification Search
CPC ................ H05K 1/0206; H05K 1/185; H05K 2201/10015; H05K 2201/10106;
(Continued)

(56) References Cited

U.S. PATENT DOCUMENTS 8,101,868 B2 * 1/2012 Ito ........................ H01L 24/24
174/260
9,807,890 B2 * 10/2017 Dang ................. H05K 3/4007
(Continued)

FOREIGN PATENT DOCUMENTS

CN 102097427 A 6/2011
CN 103404239 A 11/2012
(Continued)

*Primary Examiner* — Mandeep S Buttar
(74) *Attorney, Agent, or Firm* — Morgan, Lewis & Bockius LLP

(57) ABSTRACT

The present invention relates to a carrier (2) with a passive cooling function for a semiconductor component (3), having a main body (6) with a top side (7) and a bottom side (8) and at least one electrical component (13, 13a, 13b) that is embedded in the main body (6), wherein the carrier (2) has a first thermal via (14), which extends from the top side (7) of the main body (6) to the at least one electrical component (13, 13a, 13b), wherein the carrier (2) has a second thermal via (15), which extends from the at least one electrical component (13, 13a, 13b) to the bottom side (8) of the main body (6), and wherein the at least one embedded electrical component (13, 13a, 13b) is electrically contacted by the first and the second thermal via (14, 15).

10 Claims, 3 Drawing Sheets

(51) Int. Cl.
*H01L 33/54* (2010.01)
*H01L 33/64* (2010.01)
*H05K 1/18* (2006.01)

(52) U.S. Cl.
CPC ........... *H01L 33/647* (2013.01); *H05K 1/185* (2013.01); *H05K 2201/0195* (2013.01); *H05K 2201/10015* (2013.01); *H05K 2201/10106* (2013.01); *H05K 2201/10196* (2013.01); *H05K 2201/10219* (2013.01)

(58) Field of Classification Search
CPC .......... H05K 2201/10196; H05K 2201/10219; H01L 25/167; H01L 33/54; H01L 33/647
USPC ......................................................... 361/717
See application file for complete search history.

(56) References Cited

U.S. PATENT DOCUMENTS

| | | | | |
|---|---|---|---|---|
| 2002/0038908 | A1* | 4/2002 | Ding | H01L 23/3128 |
| | | | | 257/720 |
| 2005/0046001 | A1* | 3/2005 | Warner | G06F 21/10 |
| | | | | 257/678 |
| 2006/0113645 | A1 | 6/2006 | Warner et al. | |
| 2006/0145328 | A1* | 7/2006 | Hsu | H01L 23/5389 |
| | | | | 257/690 |
| 2009/0321917 | A1* | 12/2009 | Stoehr | H01L 23/3677 |
| | | | | 257/690 |
| 2011/0108971 | A1* | 5/2011 | Ewe | H01L 21/56 |
| | | | | 257/686 |
| 2011/0180819 | A1* | 7/2011 | Van Elmpt | F21K 9/00 |
| | | | | 257/88 |
| 2013/0009325 | A1* | 1/2013 | Mori | H01L 23/5389 |
| | | | | 257/774 |
| 2013/0010446 | A1 | 1/2013 | Henrik et al. | |
| 2013/0269986 | A1* | 10/2013 | Sun | H01L 23/3677 |
| | | | | 174/252 |
| 2013/0299219 | A1 | 11/2013 | Chisaka et al. | |
| 2014/0138788 | A1* | 5/2014 | Kim | H01L 27/14618 |
| | | | | 257/433 |
| 2014/0185258 | A1* | 7/2014 | Lee | H01L 23/49822 |
| | | | | 361/761 |
| 2014/0252403 | A1* | 9/2014 | Feichtinger | H01C 7/12 |
| | | | | 257/99 |
| 2015/0243865 | A1* | 8/2015 | Feichtinger | H01L 33/642 |
| | | | | 257/88 |
| 2016/0021730 | A1* | 1/2016 | Decker | H05K 1/0207 |
| | | | | 361/720 |
| 2016/0174381 | A1* | 6/2016 | Lee | H05K 1/185 |
| | | | | 361/761 |
| 2017/0309802 | A1* | 10/2017 | Feichtinger | H01L 33/62 |

FOREIGN PATENT DOCUMENTS

| | | |
|---|---|---|
| CN | 103378014 A | 10/2013 |
| CN | 103703874 A | 4/2014 |
| DE | 102010038154 A1 | 5/2011 |
| DE | 102013203932 A1 | 9/2014 |
| JP | 2009-164287 A | 7/2009 |
| JP | 5423874 B2 | 2/2014 |
| JP | 2014131039 A | 7/2014 |
| JP | 572684 B2 | 8/2014 |
| WO | WO-2012111711 | 7/2014 |
| WO | 2014/202282 A1 | 12/2014 |

* cited by examiner

CARRIER WITH A PASSIVE COOLING FUNCTION FOR A SEMICONDUCTOR COMPONENT

The present invention relates to a carrier for a semiconductor component and to an apparatus that has a carrier and a semiconductor component arranged on the carrier.

Here, the semiconductor component may be, in particular, a light-emitting diode.

Various aspects such as luminous efficiency, lifetime and thermal management play an important role in the design of carriers for light-emitting diodes. In addition to the functional and thermomechanical requirements, there are also geometric problems to be solved. Particularly in the case of mobile applications, for example in light-emitting diodes that are integrated into the camera flash of a cell phone, the carrier and further components, such as discrete protection components and sensors, should have the smallest possible space requirement and the smallest possible construction height.

A further important requirement of a carrier for a light-emitting diode consists in enabling the most unhindered emission of light by the light-emitting diode that is possible and thereby, in particular, avoiding shadings.

The object of the present invention is to provide an improved carrier for a semiconductor component that enables good thermal management, for example.

Said object is achieved by the subject matter of the present claim 1.

A carrier with a passive cooling function for a semiconductor component is proposed, said carrier having a main body with a top side and a bottom side and at least one electrical component that is embedded in the main body. Furthermore, the carrier has a first thermal via, which extends from the top side of the main body to the at least one electrical component. The carrier has a second thermal via, which extends from the at least one electrical component to the bottom side of the main body. The at least one electrical component is electrically contacted by the first and the second thermal via.

The first and the second thermal via therefore fulfill two functions in the carrier. They enable both the electrical contacting of the at least one embedded component and a reduction in the thermal resistance of the main body, since they are suitable, on account of their high thermal conductivity, for dissipating heat that has been emitted by a semiconductor component fixed on the carrier quickly and effectively from the top side of the main body.

In accordance therewith, the thermal vias ensure passive cooling of the carrier and/or the semiconductor component. The cooling of electrical or electronic devices solely on the basis of "free" convection is referred to here as passive cooling. In this case, waste heat can be dissipated to the surrounding air.

By virtue of the fact that the at least one electrical component is embedded in the carrier, the carrier can be free of components applied on the top side, with the result that a low height of the carrier can be realized overall. As a result, the construction height, which is critical in particular in mobile applications, can be reduced significantly.

The carrier may be suitable for the semiconductor component, for example a light-emitting diode chip, to be able to be mounted directly on the carrier. This may be effected by AuSn eutectic bonding or an AuSn reflow method, for example. Here, the carrier is designed in such a way that the semiconductor component, for example a light-emitting diode, can be arranged on the top side of the main body. The carrier can accommodate one semiconductor component or a plurality of semiconductor components.

The term "embedded" should be understood here as meaning that the embedded electrical component is surrounded on all sides by a layer of the main body or a thermal via, respectively. Openings, in which the electrical component is enclosed, are formed in the main body. The electrical component is completely enclosed on the top side, the bottom side and the lateral faces thereof by material of the main body and by the thermal vias.

A via (Vertical Interconnect Access) is defined as a plated through-hole that enables a vertical electrical connection between various levels of the main body, wherein "vertical" here refers to the direction from the bottom side of the main body to the top side of the main body. A thermal via is defined here as a plated through-hole that is distinguished by a high thermal conductivity of at least 250 W/(m·K). A thermal via serves to lead heat away from the top side of the main body. A thermal via may comprise copper or silver or consist of copper or silver.

The described carrier is distinguished by an efficient dissipation of the heat emitted by the semiconductor component, which results on account of the low thermal resistance of the thermal vias. As a result of this, the lifetime of the semiconductor component can be improved. Alternatively or in addition, it may be made possible for the semiconductor component to be operated using a higher power than would be possible for a comparable carrier without thermal vias, since only the thermal vias make it possible to dissipate the heat that is additionally generated due to the increased power.

Furthermore, the carrier can have at least one further thermal via, which extends from the top side of the main body to the bottom side of the main body. The further thermal via can be a pure thermal via that does not serve for contacting of the embedded component. The thermal conductivity of the main body can be further improved by the at least one further thermal via.

Furthermore, the carrier can have a metallic structure that is embedded in the main body and that is elongated in a direction parallel to the top side of the main body, wherein the metallic structure directly abuts the further thermal via. In particular, the metallic structure can touch the further thermal via. The metallic structure can also directly abut a plurality of further thermal vias. Further material with a high thermal conductivity is incorporated in the main body by the metallic structure, with the result that the thermal conductivity of the entire main body is increased. In particular, the metallic structure contributes to heat being dissipated quickly from the top side of the main body. The metallic structure can be designed as a block or as a strip, for example.

The main body can have a multilayer construction, wherein the metallic structure and the embedded electrical component are arranged in the same layer.

The embedded electrical component can be a varistor, a diode, an NTC thermistor, a PTC thermistor, a multilayer ceramic chip capacitor, a multilayer inductance or a driver circuit for the at least one semiconductor component.

The embedded component can be suitable for protecting the semiconductor component against damage by an excessively high applied voltage. An ESD protection component of this kind can be a varistor or a diode, for example.

The embedded component can also enable a defined thermal linking of the semiconductor component. NTC and PTC thermistors in particular are suitable for this purpose. In the case of an appropriate interconnection with the semiconductor component, said NTC and PTC thermistors can prevent damage to the semiconductor component caused by excessively high temperatures.

It is also possible for the embedded component to be a driver circuit or a regulating circuit for driving the semiconductor component.

In particular, the embedded component can be any active electronic component (such as, for example, an electronic chip, in particular a semiconductor chip) or any desired passive electronic component (such as, for example, a capacitor, a resistor, a varistor, an NTC, a PTC or an inductance). Examples of the embedded modules or components are a data memory, such as, for example, a DRAM (or any other desired memory), a filter (which may be configured as a high-pass filter, a low-pass filter or a band-pass filter, for example, and which may serve for frequency filtering, for example), an integrated circuit (such as, for example, a logic IC), a signal processing component (such as, for example, a microprocessor), a power management component, an optical-electrical interface element (for example an optoelectronic component), a voltage converter (such as, for example, a DC/DC converter or an AC/DC converter), an electromechanical converter (for example a PZT (lead zirconate titanate) sensor and/or actuator), a transmission and/or reception unit for electromagnetic waves (for example an RFID chip or transponder), a cryptographic component, a capacitance, an inductance, a switch (for example a transistor-based switch) and a combination of these and other functional electronic component parts. The component can also have a microelectromechanical system (MEMS), a battery, a camera or an antenna.

The main body can comprise an at least one material from a group consisting of resin, in particular bismaleimide-triazine resin, glass, in particular glass fibers, prepreg material, polyimide, a liquid-crystal polymer, cyanate esters, epoxy-based build-up film, FR4 material, a ceramic and a metal oxide. FR4 refers to a class of composite materials consisting of epoxy resin and glass fiber fabrics. Resin-glass fiber laminates are distinguished by a high dielectric strength and a high mechanical strength. Moreover, they can have a coefficient of thermal expansion that is well adapted to the coefficient of thermal expansion of the semiconductor component, with the result that thermomechanical interfering influences can be kept low.

The carrier can have a height of less than 500 μm, preferably a height of less than 350 μm. In particular, the carrier can have a height between 200 and 500 μm, preferably between 200 and 350 μm. Such a low height is made possible by the integration of the electrical component in the carrier. In this way, it is possible to design carriers that do not have a component arranged on the top side of the carrier. It is, however, also possible to design the carrier in such a way that further electrical components are arranged on the surface as SMD (Surface Mounted Device) components.

Furthermore, the carrier can have a third thermal via, which extends from the top side of the main body to the electrical component, and a fourth thermal via, which extends from the electrical component to the bottom side of the main body. The embedded electrical component can in this case also be electrically contacted by the third and the fourth thermal via.

Furthermore, at least one second electrical component can be embedded in the main body, wherein the carrier has a fifth thermal via, which extends from the top side of the main body to the second electrical component, wherein the carrier has a sixth thermal via, which extends from the electrical component to the bottom side of the main body, and wherein the embedded electrical component is electrically contacted by the fifth and the sixth thermal via. In accordance therewith, the carrier can have a plurality of embedded electrical components. For example, the first embedded component could be an ESD protection component, such as a varistor or a diode for instance, and the second embedded component could be a temperature sensor or a component for controlling the thermal linking of the semiconductor component, such as a PTC or an NTC thermistor for instance, wherein the two components can be interconnected with the same semiconductor component. The interconnection of the semiconductor component with a PTC thermistor can protect the semiconductor component from overcurrents. The interconnection of the semiconductor component with an NTC thermistor can protect the semiconductor component from overheating.

In accordance with a further aspect, an apparatus that has the above-described carrier and a semiconductor component is proposed, wherein the semiconductor component is arranged on the top side of the carrier.

The semiconductor component can be a light-emitting diode.

The invention is described in more detail below with reference to figures.

Figure 1:
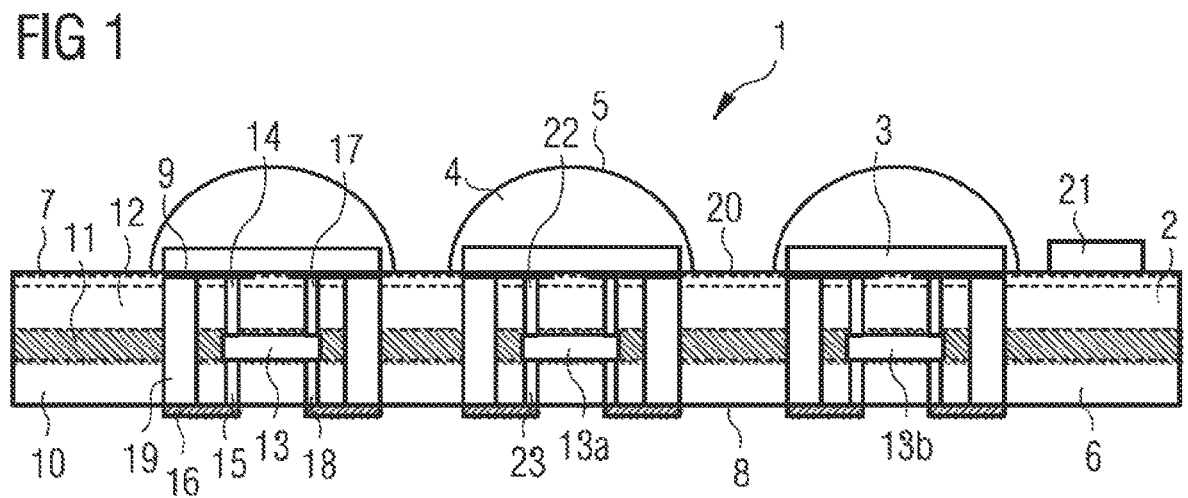
FIG. 1 shows a first exemplary embodiment of an apparatus.

FIG. 1 shows a first exemplary embodiment of an apparatus 1. The apparatus 1 has a carrier 2 for a plurality of semiconductor components 3. The semiconductor components 3 here are in each case light-emitting diodes. Three semiconductor components 3 are arranged on the carrier 2. A protective layer 4 designed as a lens is arranged on each semiconductor component 3. The protective layer 4 comprises silicone. Furthermore, the protective layer 4 is covered with a further phosphor layer 5.

The carrier 2 has a main body 6 with a top side 7 and a bottom side 8. The carrier 2 is designed in such a way that the semiconductor components 3 can be secured, for example soldered, to the top side 7 of the main body 6. To that end, the main body 6 has contact faces 9 on the top side 7 thereof.

The main body 6 has a multilayer construction. In this case, the main body 6 has at least one bottom layer 10, one middle layer 11 and one top layer 12. The bottom layer 10 has the bottom side 8 of the main body 6. The top layer 12 has the top side 7 of the main body 6. The middle layer 11 is arranged between the bottom and the top layer 10, 12. Each of said layers 10, 11, 12 comprises a glass fiber-resin mixture. The layers 10, 11, 12 of the main body 6 can differ from one another in the mixing ratio of glass fiber to resin. The layers comprise an FR4.

An electrical component 13 is embedded in the middle layer 11 of the main body 6. The middle layer 11 has openings in the glass fiber-resin layer, the embedded electrical component 13 being arranged in said openings. The component 13 is laterally delimited by the middle layer 11. The top layer 12 is arranged above the component 13 and the bottom layer 10 is arranged below the component 13. In accordance therewith, the component 13 is enclosed on each side by a layer 10, 11, 12 of the main body 6.

The component 13 can be a varistor, a diode, an NTC thermistor, a PTC thermistor, a multilayer ceramic chip capacitor (multilayer ceramic capacitor, MLCC), a multilayer inductance (multilayer inductor, ML inductor) or a driver circuit for the semiconductor component 3.

Furthermore, the carrier 2 has a first thermal via 14, which extends from the top side 7 of the main body 6 to the electrical component 13. In this case, the first thermal via contacts the electrical component 13 with one of the contact faces 9 arranged on the top side 7.

Furthermore, the carrier 2 has a second thermal via 15, which extends from the electrical component 13 to the bottom side 8 of the main body 6. In this case, the second thermal via 15 contacts the component 13 with an electrical contact 16 arranged on the bottom side 8 of the main body 6. In accordance therewith, the first and the second thermal via 14, 15 ensure an electrical contacting of the component 13.

Furthermore, the carrier 2 has a third thermal via 17, which extends from the top side 7 to the component 13, and a fourth thermal via 18, which extends from the embedded electrical component 13 to the bottom side 8. The embedded component 13 is also electrically contacted by means of the third and the fourth thermal via 17, 18.

The first to fourth thermal vias 14, 15, 17, 18 fulfill two functions in the present carrier 2. On the one hand, they ensure the electrical contacting of the embedded component 13. On the other hand, they reduce the thermal resistance of the carrier 2. In accordance therewith, the first to fourth thermal vias 14, 15, 17, 18 make it possible to lead heat that has been generated by the semiconductor component 3 quickly and effectively away from the top side 7 of the main body 6. In this way, the thermal vias 14, 15, 17, 18 ensure passive cooling of the carrier 2 and of the semiconductor component 3. To that end, the thermal vias 14, 15, 17, 18 comprise a material that possesses a high thermal conductivity. The thermal vias 14, 15, 17, 18 comprise copper or silver, for example. They can also consist of copper or silver. Both materials are distinguished by a very high thermal conductivity. Pure copper has a thermal conductivity of 401 W/(m·K). Pure silver has a thermal conductivity of 429 W/(m·K).

Furthermore, the carrier 2 has further thermal vias 19, which extend from the top side 7 to the bottom side 8. Said further thermal vias 19 serve the sole purpose of reducing the thermal resistance of the carrier 2, that is to say of ensuring passive cooling of the carrier 2 and of the semiconductor component 3. Said further thermal vias 19 likewise comprise copper or silver. The further thermal vias 19 are not contacted with the embedded component 13.

The further thermal vias 19 have a greater diameter than the first to fourth thermal vias 14, 15, 17, 18, with which the electrical component 13 is contacted. In particular, the further thermal vias 19 have a diameter between 100 and 200 µm, preferably between 130 and 170 µm. The first to fourth thermal vias 14, 15, 17, 18 have a diameter between 40 and 100 µm, preferably between 40 and 70 µm.

The top side 7 of the main body 6 is coated with a reflection layer 20. Said reflection layer is suitable for reflecting light emitted by the semiconductor component 3 and thus for improving the reflectance of the carrier 2. The reflection layer 20 can comprise a filled polymer or filled glass.

Furthermore, an SMD (Surface Mounted Device) component 21 is arranged on the top side 7 of the carrier 2, said component not being embedded in the main body 6.

A second electrical component 13a and a third electrical component 13b are embedded in the main body 6. Said components are each electrically connected by means of thermal vias to contact faces 9 arranged on the top side 7 of the main body. For example, the second electrical component 13a is connected by means of a fifth thermal via 22 to the top side 7.

Furthermore, the second and the third component 13a, 13b are electrically connected by means of thermal vias to electrical contacts 16 on the bottom side 8 of the main body 6. For example, the second component 13a is connected by means of a sixth thermal via 23 to the bottom side 8.

The second and the third embedded component 13a, 13b can be designed and interconnected in the same way as the first embedded component 13. The features described in connection with the first component 13 also apply to the second and the third embedded component 13a, 13b.

Figure 2:
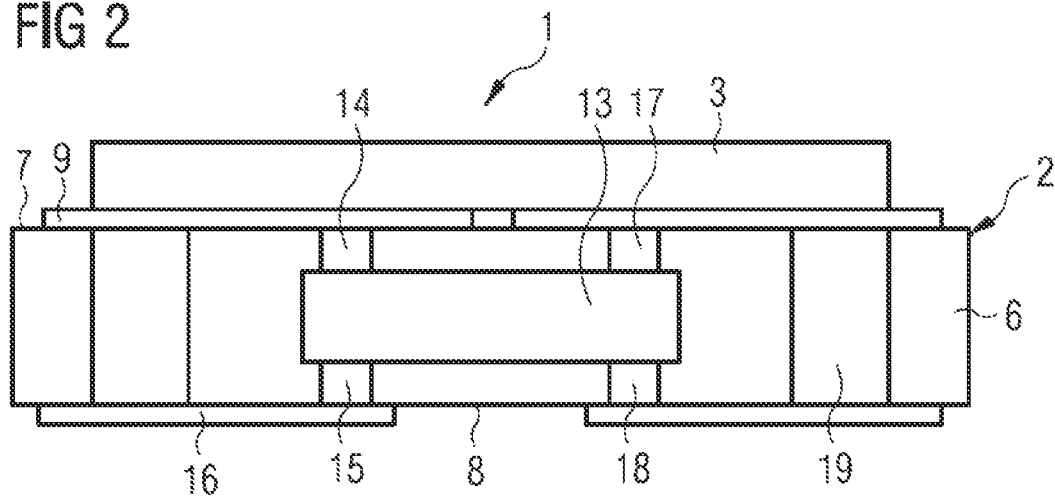
FIGS. 2 and 3 show a second exemplary embodiment of an apparatus.
Figure 3:
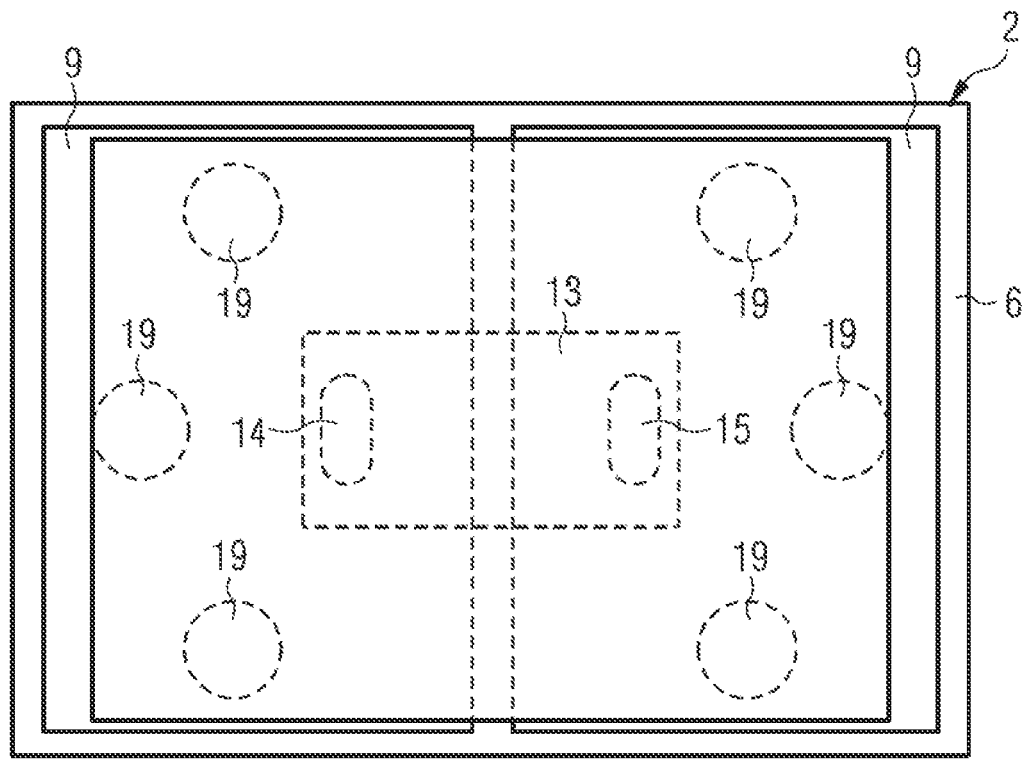

FIGS. 2 and 3 show a second exemplary embodiment of an apparatus 1 consisting of a semiconductor component 3 and a carrier 2 for the semiconductor component 3, wherein the semiconductor component 3 is a light-emitting diode. FIG. 2 shows a cross section through the apparatus 1 along a vertical plane and FIG. 3 shows a horizontal cross section.

The apparatus 1 in accordance with the second exemplary embodiment substantially corresponds to the apparatus 1 explained in accordance with the first exemplary embodiment. Here, however, only contact faces 9 for a single semiconductor component 3 are provided on the carrier 2. Furthermore, precisely one component 13 is embedded into the main body 6.

The embedded component 13 can comprise ZnOPr, which has a thermal conductivity of 40 W/(m·K). The main body 6 can comprise an FR4 with a thermal conductivity of 0.62 W/(m·K). By contrast, the thermal vias 14, 15, 17, 18, 19 can have a substantially higher thermal conductivity, as described above.

The carrier 2 can have a height of less than 500 µm, preferably a height between 200 and 350 µm. A carrier 2 of this kind is substantially lower than carriers 2 that have SMD components 21 arranged on the top side 7 thereof. In accordance therewith, embedding the electrical component 13 in the carrier 2 can significantly reduce the overall height of the arrangement. It is also possible for a plurality of components 13, 13a, 13b to be embedded in a carrier having a height of less than 500 µm.

FIG. 3 indicates the arrangement of the further thermal vias 19 and the first and the third thermal via 14, 17. The further vias 19 are arranged around the embedded component 13. FIG. 3 shows that said further vias 19 have a comparatively large cross section, which improves the thermal conductivity thereof. The first and the third via 14, 17 have an elongate cross section. The second and the fourth via 15, 18 can also have an elongate cross section of this kind.

The further thermal vias 19 have a diameter of 150 µm and a minimum distance from one another of at least 200 µm. The further vias 19 have a minimum distance of 200 µm with respect to the embedded component 13. The further vias 19 have a distance of at least 125 µm from the edge of the carrier 2. The embedded component 13 has a distance of at least 380 µm from the edge. The embedded component 13 has a height between 80 and 200 µm given an overall height of the main body 6 of 300 µm. The first to fourth vias 14, 15, 17, 18 in each case have an extent of 60 µm in a first direction and an extent of 100 µm in a second direction that is perpendicular to the first direction. The bottom and the top layer 10, 12 of the main body 6 have a thickness of at least 50 µm. The contact faces 9, 16 arranged on the top and bottom side 7, 8 of the main body 6 consist of copper and have a thickness of 30+/−10 µm. Said faces are spaced apart from the lateral edges of the main body 6 by at least 75 µm.

The sizes specified here allow for a stable carrier 2, which is distinguished, in particular, by a low construction height and a high thermal conductivity enabling the semiconductor component 3 to be operated using a high power.

Figure 4:
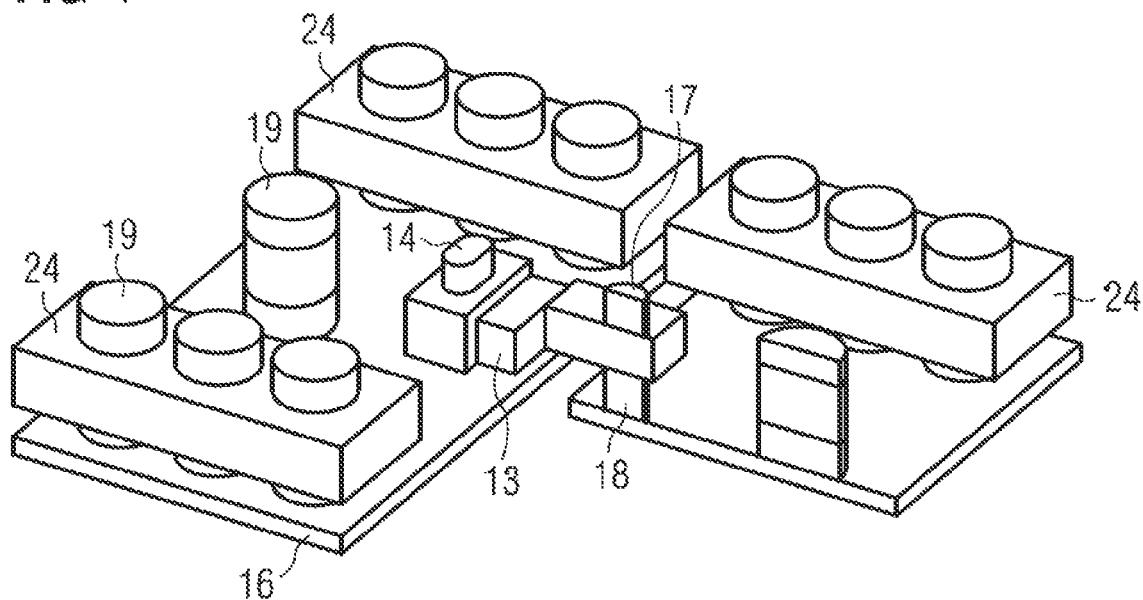
FIGS. 4 and 5 show a perspective view of a third exemplary embodiment for a carrier for a semiconductor component.
Figure 5:
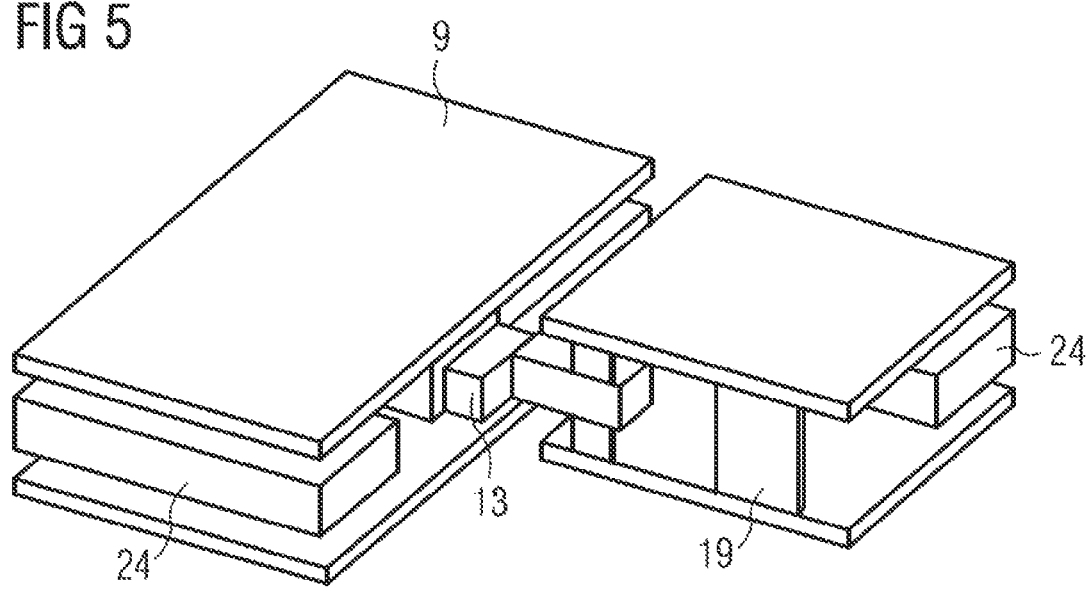

FIGS. 4 and 5 show a perspective view of a third exemplary embodiment for a carrier 2 for a semiconductor component 3. The main body 6 and the contact faces 9 arranged on the top side 7 of the main body are not drawn in FIG. 4, for the sake of better illustration. In FIG. 5, only the main body 6 is not drawn.

The carrier 2 in accordance with the third embodiment has metallic structures 24 that are embedded in the main body 6. The metallic structures 24 are arranged in the middle layer 11 of the main body 6, the embedded electrical component 13 also being arranged in said middle layer. The metallic structures 24 are in each case connected to three further thermal vias 19. In particular, said metallic structures directly enclose the further thermal vias 19 and abut them. The metallic structures 24 improve the thermal conductivity of the thermal vias 19 that are touched by said metallic structures.

FIGS. 4 and 5 in each case show metallic structures 24 that are designed as blocks. Metallic structures 24 with different shapes are also possible, for example strips or windows. A frame-shaped window here could, for example, have an opening in the center thereof and be arranged in such a way that it encloses the metallic component 13 embedded in the main body 6 and arranges said component in the opening. A strip has only a very small height, which can be lower than 10 μm, for example. In this case, the extent in the direction from the bottom side 8 to the top side 7 is referred to as the height.

LIST OF REFERENCE SIGNS

1 Apparatus
2 Carrier
3 Semiconductor component
4 Protective layer
5 Phosphor layer
6 Main body
7 Top side
8 Bottom side
9 Contact faces
10 Bottom layer
11 Middle layer
12 Top layer
13 Electrical component
13a Electrical component
13b Electrical component
14 First thermal via
15 Second thermal via
16 Electrical contact
17 Third thermal via
18 Fourth thermal via
19 Further thermal via
20 Reflection layer
21 SMD component
22 Fifth thermal via
23 Sixth thermal via
24 Metallic structure

The invention claimed is:

1. A carrier with a passive cooling function for a semiconductor component, comprising: a main body with a top layer at a top side of the main body, a middle layer, and a bottom layer at a bottom side of the main body; at least one electrical component that is embedded in the main body; a first thermal via, which extends from the top side of the main body to the at least one electrical component; a second thermal via, which extends from the at least one electrical component to the bottom side of the main body; and at least one further thermal via, which extends from the top side of the main body to the bottom side of the main body, wherein the at least one electrical component is electrically contacted by the first and the second thermal via, wherein the first thermal via and the second thermal via ensure passive cooling of at least one of the carrier or a semiconductor component fixed on the carrier, wherein the carrier has a height of less than 500 μm, wherein the middle layer is disposed between the top layer and the bottom layer of the main body, wherein a metallic structure is embedded in the middle layer and is elongated in a direction parallel to the top side of the main body, wherein the metallic structure directly abuts the further thermal via, wherein at least one second electrical component is embedded in the main body, wherein the carrier has a fifth thermal via, which extends from the top side of the main body to the at least one second electrical component, wherein the carrier has a sixth thermal via, which extends from the at least one second electrical component to the bottom side of the main body, and wherein the at least one second electrical component is electrically contacted by the fifth and the sixth thermal via.

2. The carrier according to claim 1, wherein the at least one further thermal via has a diameter that is greater than the diameter of the first thermal via and that is greater than the diameter of the second thermal via.

3. The carrier according to claim 1, wherein the main body has a multilayer construction, and
wherein the metallic structure and the at least one electrical component are arranged in the same layer.

4. The carrier according to claim 1, wherein the at least one electrical component is a varistor, a diode, an NTC thermistor, a PTC thermistor, a multilayer ceramic chip capacitor, a multilayer inductance or a driver circuit for the semiconductor component.

5. The carrier according to claim 1, wherein the at least one electrical component comprises a microelectromechanical system (MEMS), a battery, a camera, an antenna, an active electronic component, a passive electronic component, or an embedded module, wherein the active electronic component comprises an electronic chip, a semiconductor chip or another active electronic component, wherein the passive electronic component comprises a capacitor, a resistor, a varistor, an NTC, a PTC, an inductance or another passive electronic component, and wherein the embedded module comprises one or more of the following: a data memory, including a DRAM or another memory; a filter, including a high-pass filter, a low-pass filter or a band-pass filter, and configured to serve for frequency filtering; an integrated circuit, including a logic integrated circuit or another integrated circuit; a signal processing component, including a microprocessor or another signal processing component; a power management component; an optical-electrical interface element, including an optoelectronic component or another optical-electrical interface element; a voltage converter, including a DC/DC converter, an AC/DC converter or another voltage converter; an electromechanical converter, including a lead zirconate titanate sensor, an actuator, or another electromechanical converter; a transmission and/or reception unit for electromagnetic waves, including an RFID chip, a transponder or another transmission and/or reception unit; a cryptographic component; a capacitance; an inductance; and a switch, including a transistor-based switch or another switch.

6. The carrier according to claim 1, wherein the main body comprises at least one material from a group consisting of resin, in particular bismaleimide-triazine resin, glass, in particular glass fibers, prepreg material, polyimide, a liquid-crystal polymer, cyanate esters, epoxy-based build-up film, FR4 material, a ceramic and a metal oxide.

7. The carrier according to claim 1, further comprising:
a third thermal via, which extends from the top side of the main body to the at least one electrical component,
wherein the carrier has a fourth thermal via, which extends from the at least one electrical component to the bottom side of the main body, and
wherein the at least one electrical component is also electrically contacted by the third and the fourth thermal via.

8. An apparatus, having a carrier according to claim 1 and a semiconductor component that is arranged on the top side of the carrier.

9. The carrier according to claim 1, wherein the carrier has a height between 200 µm and 500 µm.

10. The carrier according to claim 1 wherein at least one second electrical component is embedded in the main body and wherein the at least one electrical component is an ESD protection component.

* * * * *

UNITED STATES PATENT AND TRADEMARK OFFICE
CERTIFICATE OF CORRECTION

PATENT NO. : 10,980,105 B2
APPLICATION NO. : 15/561504
DATED : April 13, 2021
INVENTOR(S) : Thomas Feichtinger et al.

Page 1 of 1

It is certified that error appears in the above-identified patent and that said Letters Patent is hereby corrected as shown below:

On the Title Page

Item (71) Applicants should read:
TDK Electronics AG, Munich (DE);
AT&S Austria Technologie & Systemtechnik AG, Leoben (AT)

Item (73) Assignees should read:
TDK Electronics AG, Munich (DE);
AT&S Austria Technologie & Systemtechnik AG, Leoben (AT)

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*